United States Patent [19]

Bandyopadhyay et al.

[11] Patent Number: 5,846,876
[45] Date of Patent: Dec. 8, 1998

[54] INTEGRATED CIRCUIT WHICH USES A DAMASCENE PROCESS FOR PRODUCING STAGGERED INTERCONNECT LINES

[75] Inventors: Basab Bandyopadhyay; H. Jim Fulford, Jr.; Robert Dawson; Fred N. Hause; Mark W. Michael; William S. Brennan, all of Austin, Tex.

[73] Assignee: Advanced Micro Devices, Inc.

[21] Appl. No.: 655,244

[22] Filed: Jun. 5, 1996

[51] Int. Cl.⁶ .................................................. H01L 21/4763
[52] U.S. Cl. .......................... 438/622; 438/624; 438/629; 438/633; 438/637; 438/638; 438/700
[58] Field of Search ........................ 438/622, 624, 438/629, 633, 637, 638, 700

[56] References Cited

U.S. PATENT DOCUMENTS

| | | | |
|---|---|---|---|
| 4,832,789 | 5/1989 | Cochran et al. | 438/638 |
| 4,952,528 | 8/1990 | Abe et al. | 438/638 |
| 4,962,058 | 10/1990 | Cronin et al. | 438/622 |
| 5,034,347 | 7/1991 | Kakihana | 438/638 |
| 5,192,714 | 3/1993 | Suguro et al. | 438/622 |
| 5,252,516 | 10/1993 | Nguyen et al. | 438/637 |
| 5,305,519 | 4/1994 | Yamamoto et al. | 438/637 |
| 5,451,551 | 9/1995 | Krishnan et al. | 438/633 |
| 5,459,093 | 10/1995 | Kuroda et al. | 438/622 |
| 5,468,682 | 11/1995 | Homma | 438/633 |
| 5,471,093 | 11/1995 | Cheung . | |
| 5,490,901 | 2/1996 | Kim | 438/638 |
| 5,514,613 | 5/1996 | Santadrea et al. | 438/622 |
| 5,604,156 | 2/1997 | Chung et al. | 438/638 |
| 5,629,236 | 5/1997 | Wada et al. | 438/622 |
| 5,693,568 | 12/1997 | Liu et al. | 438/622 |
| 5,759,911 | 6/1998 | Cronin et al. | 438/622 |

OTHER PUBLICATIONS

International Search Report for PCT/US 97/02513 dated Jun. 20, 1997.

Wolf et al., *Silicon Processing For The VLSI Era,* vol. II, Lattice Press pp. 279–287, 1990.

*Primary Examiner*—John F. Niebling
*Assistant Examiner*—Lynne A. Gurley
*Attorney, Agent, or Firm*—Kevin L. Daffer; Robert C. Kowert; Conley, Rose & Tayon

[57] ABSTRACT

An improved multilevel interconnect structure is provided. The interconnect structure includes several levels of conductors, wherein conductors on one level are staggered with respect to conductors on another level. In densely spaced interconnect areas, interposed conductors are drawn to dissimilar elevational levels to lessen the capacitive coupling between the interconnects. By staggering every other interconnect line in the densely patterned areas, the interconnects are capable of carrying a larger amount of current with minimal capacitive coupling therebetween.

9 Claims, 5 Drawing Sheets

INTEGRATED CIRCUIT WHICH USES A DAMASCENE PROCESS FOR PRODUCING STAGGERED INTERCONNECT LINES

BACKGROUND OF THE INVENTION

1. Field of the Invention

This invention relates to semiconductor fabrication and more particularly to an integrated circuit which employs staggered interconnects formed using a damascene process. The interconnect lines are produced such that one interconnect line is configured in a plane dissimilar from, and laterally spaced between, a pair of interconnect lines. By staggering the interconnect lines, a higher density interconnect structure can be produced with minimal electric field coupling between the interconnect lines.

2. Description of the Relevant Art

An integrated circuit includes numerous conductors extending across the topography of a monolithic substrate. A set of interconnect lines (or conductors) which serve to electrically connect two or more components within a system is generally referred to as a "bus". A collection of voltage levels are forwarded across the conductors to allow proper operation of the components. For example, a microprocessor is connected to memories and input/output devices by certain bus structures. There are numerous types of busses which are classified according to their operation. Examples of well-known types of busses include address busses, data busses and control busses.

Conductors within a bus generally extend partially parallel to each other across the semiconductor topography. The conductors are isolated from each other and from underlying conductive elements by a dielectric, a suitable dielectric being, for example, silicon dioxide ("oxide"). Conductors are thereby lithography patterned across the semiconductor topography, wherein the topography comprises a substrate with a dielectric placed thereon. The topography can also include one or more layers of conductors which are covered by a dielectric material. The layers of conductors overlaid with a dielectric present a topography upon which a subsequent layer of conductors can be patterned.

Conductors are made from an electrically conductive material, a suitable material includes Al, Ti, Ta, W, Mo, polysilicon, or a combination thereof. Substrate includes any type of material which can retain dopant ions and the isolated conductivity regions brought about by those ions. Typically, substrate is a silicon-based material which receives p-type or n-type ions.

Generally speaking, interconnect lines (or conductors) are fashioned upon the topography and dielectrically spaced above an underlying conductor or substrate by a dielectric thickness $T_{d1}$. Each conductor is dielectrically spaced from other conductors within the same level of conductors (i.e., substantially coplanar conductors) by a distance $T_{d2}$. Accordingly, capacitance between vertically spaced conductors, or intralevel capacitance $C_{LS}$ is determined as follows:

$$C_{LS} \approx eW_L L/T_{d1} \quad \text{(Eq. 1)}$$

Further, capacitance between horizontally spaced, substantially coplanar conductors, or interlevel capacitance $C_{LL}$ is determined as follows:

$$C_{LL} \approx eT_c L/T_{d2} \quad \text{(Eq. 2)}$$

, where e is the permittivity of the dielectric material (the dielectric material between the conductor and substrate or the dielectric material between conductors), $W_L$ is the conductor width, and L is the conductor length. Resistance of the conductor is calculated as follows:

$$R=(rL)/W_L T_c \quad \text{(Eq. 3)}$$

, where r represents resistivity of the conductive material, and $T_c$ is the interconnect thickness. Combinations of equations 1 and 3, and/or equations 2 and 3 indicate as follows the propagation delay or coupling of a conductor to an adjacent conductor:

$$RC_{LS} \approx reL^2/T_c T_{d1}$$

$$RC_{LL} \approx reL^2/W_L T_{d1}$$

Propagation delay is an important characteristic of an integrated circuit since it limits the speed (frequency) at which the circuit or circuits can operate. The shorter the propagation delay, the higher the speed of the circuit or circuits. It is therefore important that propagation delay and/or capacitive coupling be minimized as much as possible given the geometric constraints of the semiconductor topography.

Propagation delay is shown to be a function of both capacitance $C_{LS}$ as well as capacitance $C_{LL}$. In general, $C_{LS}$ can be minimized by placing the conductor on one plane substantially perpendicular to conductors on another plane. The cross-over points are therefore minimal with respect to one another. Accordingly, the inter-level capacitance $C_{LS}$ is made minimal. Conductors on the same level, however, must not cross over one another if shorting is to be avoided. As the circuit density increases, the spacing between conductors on the same level decreases. This provides concerns with respect to intra-level capacitance $C_{LL}$. A challenge thereby exists to reduce die size yet maintain $C_{LL}$ as low as possible.

Increases in $C_{LL}$ parasitic capacitance pose two major problems. First, an increase in parasitic capacitance generally causes an increase in the time at which a transition on one end of the conductor occurs at the other end. Increase in transition time (i.e., increase in speed degregation) thereby requires a longer drive period. If the conductor extends along a critical speed path, speed degregation on the line will jeopardize functionality of the overall circuit. Second, a larger parasitic capacitance causes an increase in crosstalk noise. A conductor which does not transition, nonetheless receives crosstalk noise from neighboring lines which do.

It is thereby important to minimize propagation delay especially in critical speed paths and/or between conductors which are spaced close to one another. Geometric constraints make it difficult to increase conductor thickness $T_c$ or dielectric thickness $T_{d2}$. Still further, instead of reducing length L of a conductor, most modern integrated circuits employ longer interconnect lines which compound the propagation delay problems. Accordingly, a need arises for reducing propagation delay and cross coupling by somehow maximizing dielectric thickness $T_{d2}$ between conductors on the same level. More specifically the desired configuration must be one which provides maximum spacing between densely arranged conductors, or conductors in critical speed paths.

SUMMARY OF THE INVENTION

Problems outlined above are in large part solved by an improved multilevel interconnect structure. The interconnect structure includes staggered interconnect lines formed in areas where interconnect lines are densely spaced. The interconnect lines are staggered by forming one interconnect line in a plane dissimilar from and laterally spaced between a pair of interconnect lines. The interconnect line formed between and in a plane dissimilar from a pair of interconnect lines is referred to as the intermediate interconnect line. The intermediate interconnect line is either in a plane above or below the pair of interconnect lines. According to one exemplary embodiment, the multilevel interconnect structure comprises three levels of interconnect. The first level of interconnect includes a plurality of substantially coplanar first conductors dielectrically spaced from each other. The second level of interconnect comprises a plurality of dielectrically spaced, substantially coplanar second conductors. The third level of interconnect comprises a plurality of dialectrically spaced, substantially coplanar third conductors. According to one exemplary embodiment, the intermediate interconnect line is defined as one of the plurality of third conductors, and the pair of interconnect lines is defined as a pair of the plurality of second conductors spaced adjacent each other.

The multilevel interconnect structure, and specifically the second and third conductors are arranged in a staggered configuration. Staggering the conductors on dissimilar elevational levels serves to increase the spacing between densely patterned second and third conductors. More particularly, direct electrical field between operating second and third conductors is minimized. Current within conductors is typically distributed throughout the cross-sectional area of the conductor. Elevating one conductor between a pair of conductors affords minimal direct electric field therebetween. The raised (or lowered) third conductor cross-coupling to the pair of second conductors is thereby reduced. The improved multilevel interconnect structure thereby allows formation of a dense interconnect structure but within two separate planes instead of one. Placing interconnect lines on separate planes thereby reduces propagation delay of signals sent through the lines.

Broadly speaking, the present invention contemplates a multilevel interconnect structure, comprising a first conductor arranged upon a first plane, a second conductor arranged upon a second plane, and a third conductor arranged upon a third plane. A pair of dielectric layers are arranged between the first and third planes. The second conductor is electrically coupled to a first contact, wherein the second conductor and the first contact extend through the pair of dielectric layers from the first conductor to an upper surface of the pair of dielectric layers. The second conductor and the first contact are dielectrically spaced from the third conductor. Accordingly, the second and third conductors are diagonally spaced from each other. By placing second and third conductors in different elevation levels, effective distance between those conductors is increased. By staggering the second and third conductors, an increase in effective distance between the conductors occurs but not at the expense of die size.

The present invention further contemplates a method for forming a multilevel interconnect structure. The method includes forming a pair of dielectrics upon a plurality of coplanar first conductors. A first contact is then placed partially through the pair of dielectrics. A second contact and a plurality of coplanar second conductors are also formed, wherein one of the plurality of second conductors is aligned directly over the first contact a lateral spaced distance away from the second contact. A plurality of coplanar third conductors are also formed. One of the plurality of coplanar third conductors is aligned directly over the second contact. According to one embodiment, the second contact extends entirely through the pair of conductors. According to another embodiment, a plurality of coplanar second conductors are formed by removing portions of the pair of dielectrics, filling the removed portions with a second conductor material, and then removing the second conductor material at or slightly below an upper surface of the pair of dielectrics.

BRIEF DESCRIPTION OF THE DRAWINGS

Other objects and advantages of the invention will become apparent upon reading the following detailed description and upon reference to the accompanying drawings in which.

Figure 1:
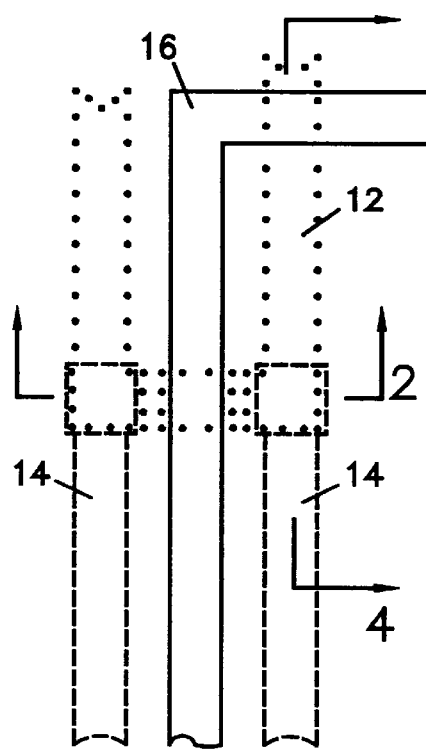
FIG. 1 is a top plan view of a multilevel interconnect structure.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Turning now to the drawings, a top plan view of a multilevel interconnect structure 10 is shown. Interconnect structure 10 includes a plurality of interconnect lines lithographically formed on dissimilar elevational levels. Interconnect lines formed on the same elevational level are spaced from each other a distance defined by the layout rules associated with the manufacturer's process. The interconnect lines of interconnect structure 10 are shown, according to one exemplary embodiment, as having three levels. A first level includes a plurality of substantially coplanar, spaced set of first conductors 12. The second level includes a plurality of substantially coplanar set of second conductors 14. The third level includes a plurality of substantially coplanar set of third conductors 16. For sake of brevity, FIG. 1 illustrates only one of the plurality of first conductors, two of the plurality of second conductors and one of the plurality of third conductors. First conductor 12 is shown as having dotted lines, second conductor 14 is shown as having dashed lines, and third conductor 16 is shown as having solid lines.

Figure 2:
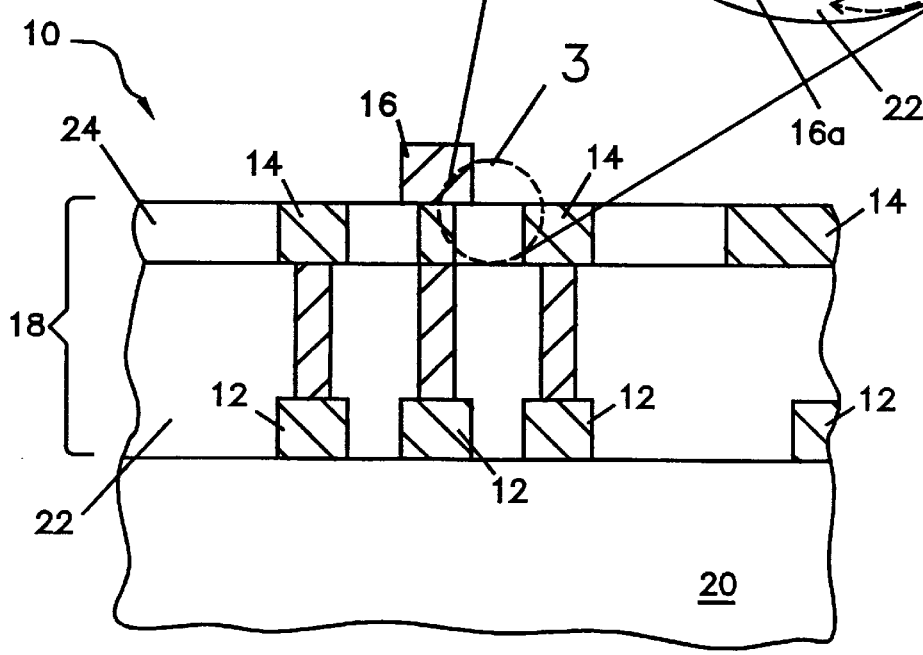
FIG. 2 is a cross-sectional view along plane 2 of FIG. 1.

FIG. 2 illustrates a cross-sectional view along plane 2 of FIG. 1. More specifically, FIG. 2 illustrates one exemplary layout attributed to numerous possible configurations of interconnect structure 10. FIG. 2 depicts the various elevational levels of first, second and third conductors 12, 14 and 16, respectively. According to the exemplary embodiment shown, second conductors 14 are placed on elevational level between the first and third conductors 12 and 16, respectively. It is understood, however, that according to an alternative embodiment, third conductors 16 can be placed within an elevational level below second conductors 14.

FIG. 2 illustrates an interlevel dielectric structure 18 formed upon semiconductor topography 20. Dielectric structure 18 comprises, according to one embodiment, two dielectric layers: a first dielectric 22 and a second dielectric 24.

Figure 3:
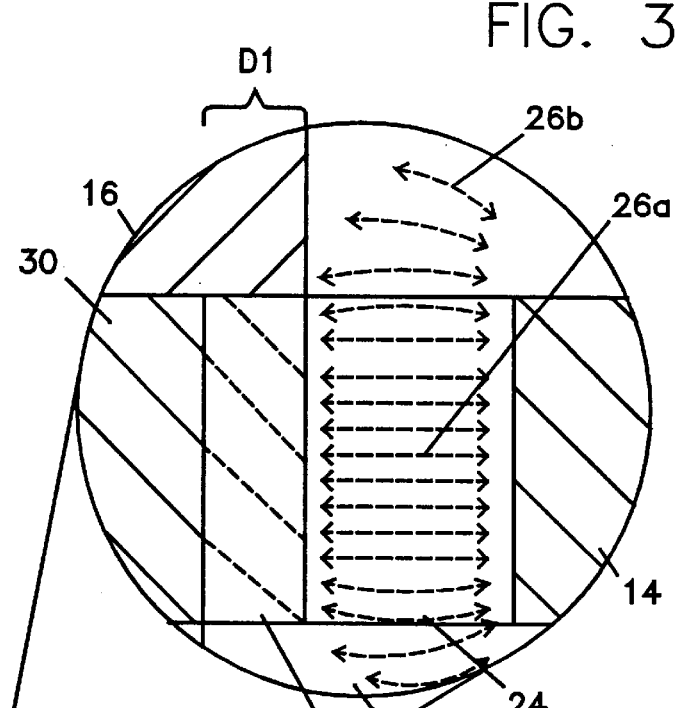
FIG. 3 is a detailed view along area 3 of FIG. 2.

FIG. 3 illustrates a detailed view along area 3 of FIG. 2. More specifically, FIG. 3 illustrates diagonally spaced second conductor 14 and third conductor 16, and the advantages thereof. Current within conductors 14 and 16 cause electric field 26 to exist therebetween. It is believed that electric field 26a is more significant (of greater magnitude) in high density areas 26a rather than low density areas 26b. Given reasonable postulation, electric field can be severe between conductive elements which are closely spaced in a lateral direction. Electric field 26a exists and would be quite large if third conductor 16 were placed on the same elevational plane as conductor 14, and configured as third conductor 16a. However, conductor 16a does not exist in accordance with the present invention and, instead, is raised or recessed to a separate elevational level across the boundary of second dielectric 24. It is believed that by raising or recessing (i.e., staggering) third conductor 16 relative to second conductor 14, electric field and capacitive coupling will be reduced across the juncture between dielectric 24 and the overlying/ underlying dielectric. The distance between midpoints (the center location of cross-sectional area) of each conductor is simply larger if the conductors are diagonally spaced (staggered) than if they are merely laterally spaced within the same elevational level. Accordingly, instead of third conductor 16 being configured as 16a, third conductor 16 is raised in a staggered position with respect to second conductors 14.

Figure 4:
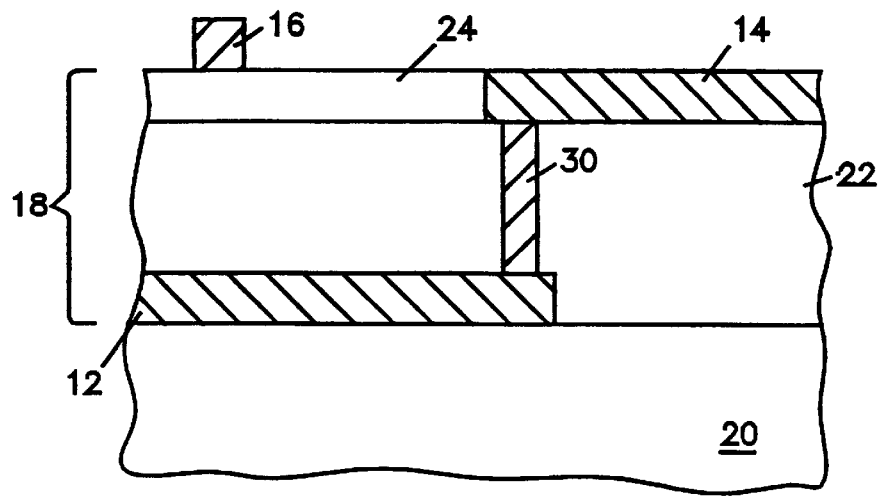
FIG. 4 is a cross-sectional view along plane 4 of FIG. 1.

Turning now to FIG. 4, a cross-sectional view along plane 4 of FIG. 1 is shown. FIG. 4 thereby depicts first conductor 12, second conductor 14 and third conductor 16 arranged on dissimilar elevational levels within interlevel dielectric structure 18 as seen along plane 4. A first contact structure 28 is shown arranged between first conductor 12 and second conductor 14. First contact 28 thereby exists only within first dielectric 22. First contact 28 is dissimilar from contact 30, which is hereinafter referred to as second contact 30. Second contact 30 is formed according to several processing steps within both first dielectric 22 and second dielectric 24, and includes two structures aligned upon one another.

Figure 5:
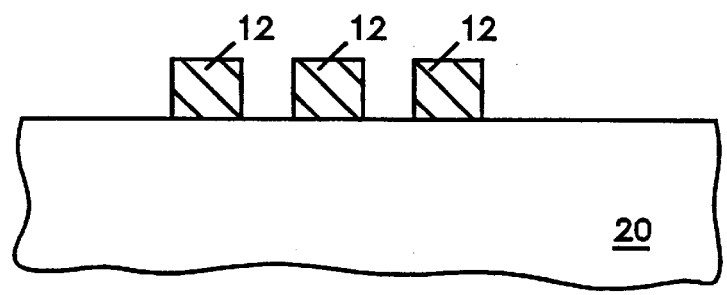
FIG. 5 is a cross-sectional view of a semiconductor topography along plane 2 showing formation of first conductors (first interconnect)

Turning now to FIG. 5, a cross-sectional view of semiconductor topography 20 is shown along plane 2. FIG. 5 illustrates an early processing step in which first conductor 12 is formed upon topography 20. First conductor 12 is preferably formed by depositing a first conductor material and thereafter selectively removing the first conductor material using a photolithography technique. Semiconductor topography 20 is herein defined as having a silicon substrate with a dielectric layer placed thereon or, in the alternative, a silicon substrate having one or more levels of interconnect and a dielectric layer placed upon the upper interconnect level. First conductor 12 can either be made of a refractory metal, aluminum or polysilicon. In the alternative, first conductor 12 can comprise dopants implanted within a silicon substrate. Thus, first conductor 12 is any region which is electrically conductive, or can be rendered electrically conductive.

Figure 6:
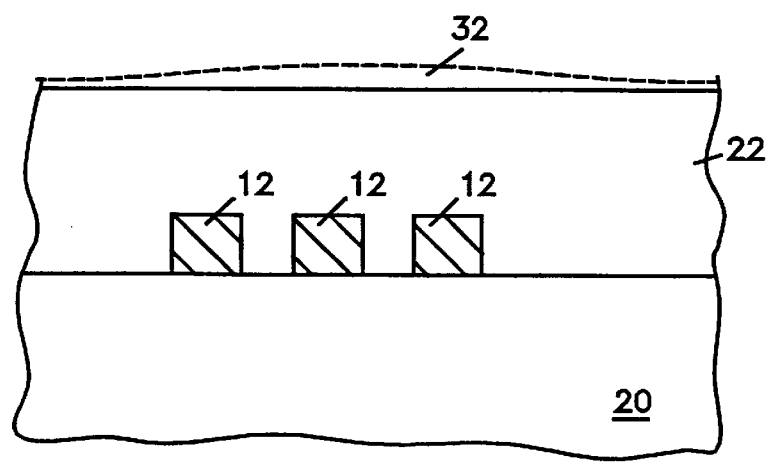
FIG. 6 is a cross-sectional view of a processing step subsequent to that shown in FIG. 5, wherein a first layer of dielectric is formed upon the first interconnect.

FIG. 6 illustrates first dielectric 22 deposited upon first conductor 12 and topography 20. First dielectric 22 is made of any dielectric material, a suitable material being silicon dioxide, or oxide. Dielectric 22 can be deposited in numerous ways, a preferred deposition technique involves chemical vapor deposition (CVD) from a silicon bearing source, such as silane or TEOS. After deposition, the upper surface of first dielectric 22 is planarized by removing peak regions commensurate with valley regions. Removed areas are shown in phantom as reference numeral 32.

Figure 7:
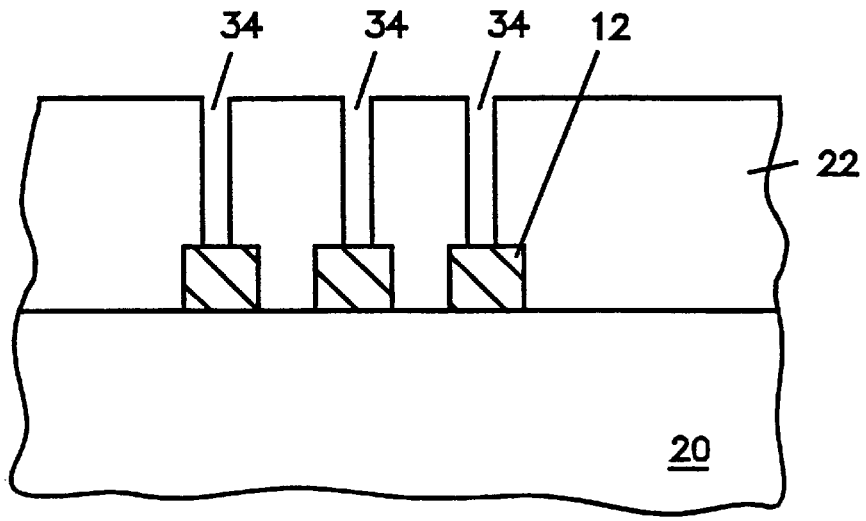
FIG. 7 is a cross-sectional view of a processing step subsequent to that shown in FIG. 6, wherein vias are formed within the first layer of dielectric to the first interconnect.
Figure 8:
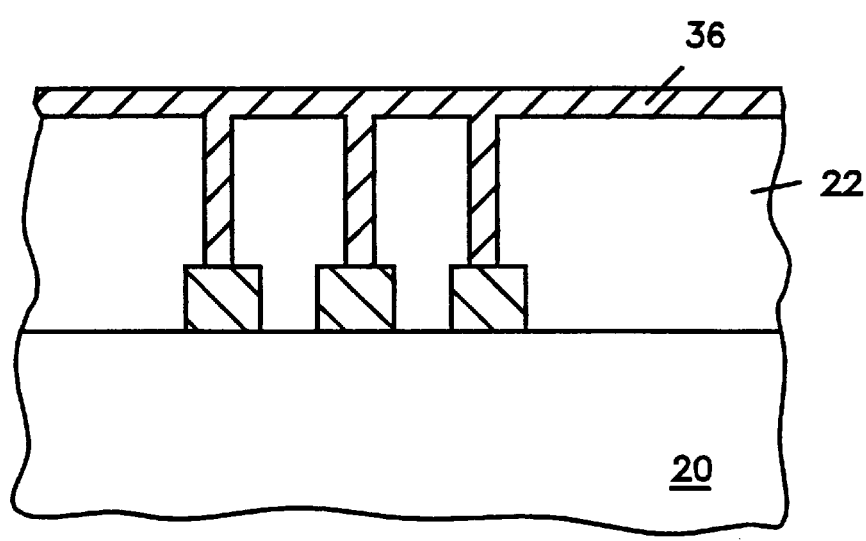
FIG. 8 is a cross-sectional view of a processing step subsequent to that shown in FIG. 7, wherein a plug conductor material is deposited within the vias and across the first layer of dielectric.

FIG. 7 illustrates the formation of vias 34. According to one embodiment, three vias 34 are etched entirely through first dielectric 22 to first conductor 12. Formation of vias 34 in select regions across first dielectric 22 is carried forth using photolithography. Vias 34 can be of any size, preferably less than the width of first, second or third conductors 12, 14 or 16, respectively. The geometry of vias 34 are chosen to allow fill material 36 to be deposited within the vias. Fill material 36 is shown in FIG. 8, and includes a metal substance capable of flowing within a relatively small width via 34. Metal 36 is preferably made of tungsten (W). Material 36 is herein defined as a "plug" conductor material.

Figure 9:
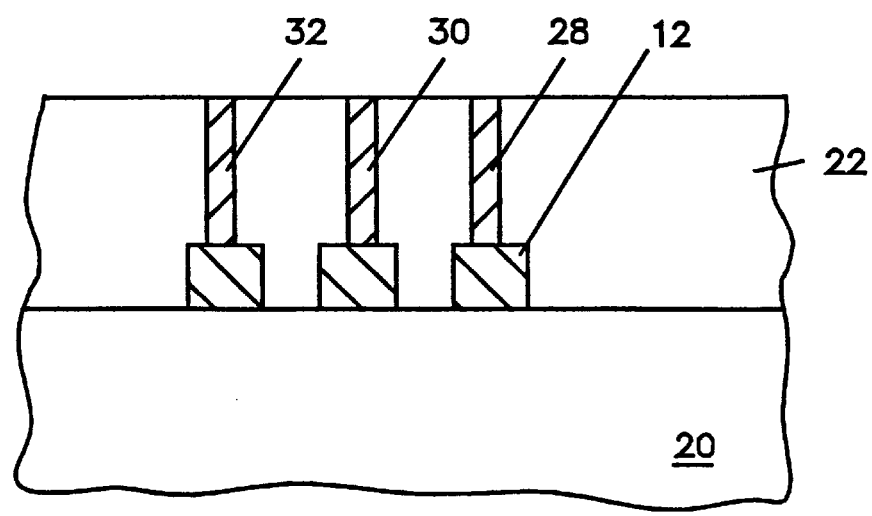
FIG. 9 is a cross-sectional view of a processing step subsequent to that shown in FIG. 8, wherein the plug conductor material is removed from upper surfaces of the first layer of dielectric.

FIG. 9 illustrates removal of plug conductor material 36 from the upper surface of first dielectric 22 such that all which remains is material 36 within vias 34. The filled vias 34 are herein defined as contacts. According to the embodiment shown, three contacts are present, and are referenced as first contact 28, second contact 30 and third contact 32. Contacts 28, 30 and 32 define an electrical path from first conductor 12 to the upper surface of dielectric 22.

Figure 10:
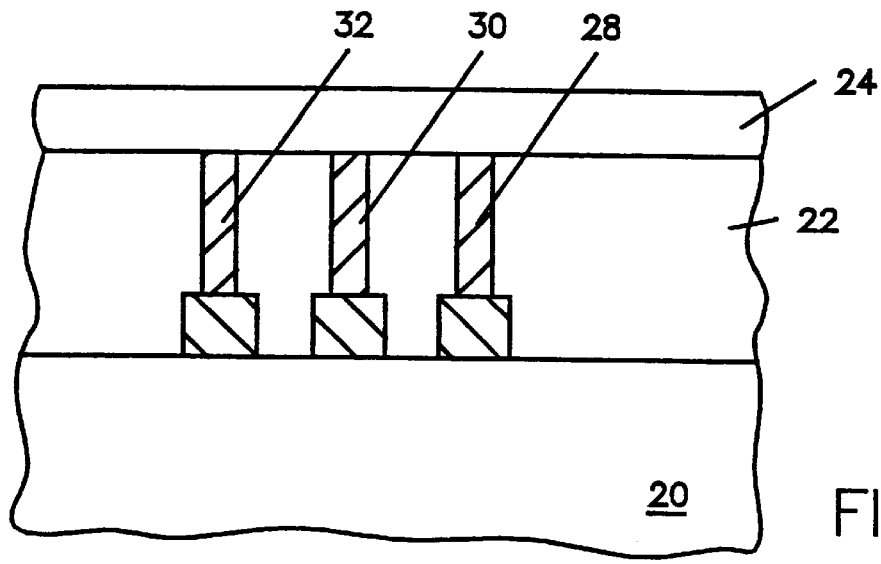
FIG. 10 is a cross-sectional view of a processing step subsequent to that shown in FIG. 9, wherein a second layer of dielectric is deposited upon the first layer of dielectric.
Figure 11:
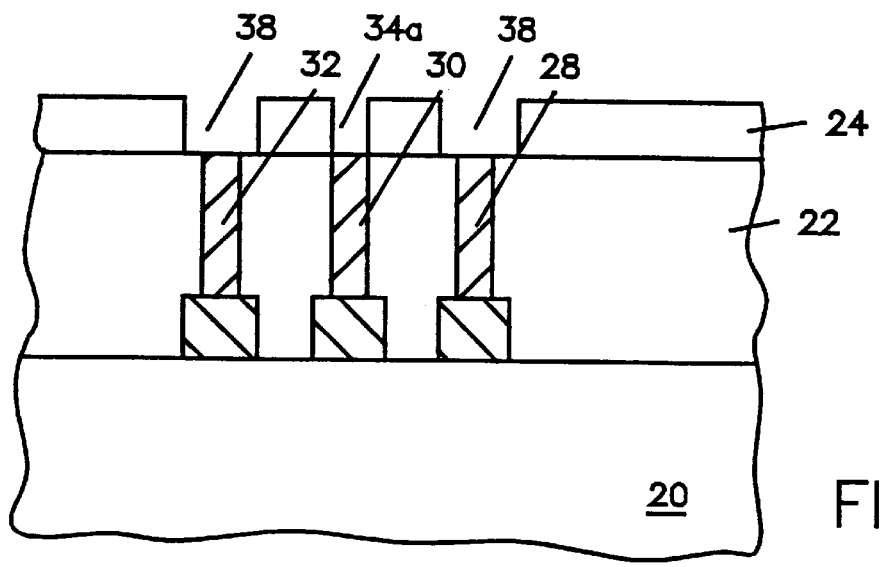
FIG. 11 is a cross-sectional view of a processing step subsequent to that shown in FIG. 10, wherein openings of varying sizes (i.e., trenches and vias) are formed within the second layer of dielectric.

FIG. 10 depicts the deposition of a second dielectric 24 upon first dielectric 22 as well as upon contacts 28, 30 and 32. Second dielectric 24 is suitably chosen from the same material as first dielectric 22, and is preferably deposited using chemical vapor deposition techniques. Second dielectric 24 is deposited to a thickness substantially equal to the thickness of a conductor. First dielectric 22, on the other hand, can be of varying thickness provided that a contact can be formed therein. FIG. 11 illustrates selective removal of second dielectric 24. Specifically, dielectric 24 is removed in regions directly above contacts 28, 30 and 32. The removed regions, according to one embodiment, comprise an intermediate via 34a and a pair of trenches 38. Via 34a and trenches 38 are produced by etching through second dielectric 24 for a time sufficient to detect the presence of plug material within the etch byproduct. Thus, etch is terminated when contacts 28, 30 and 32 are exposed.

Figure 12:
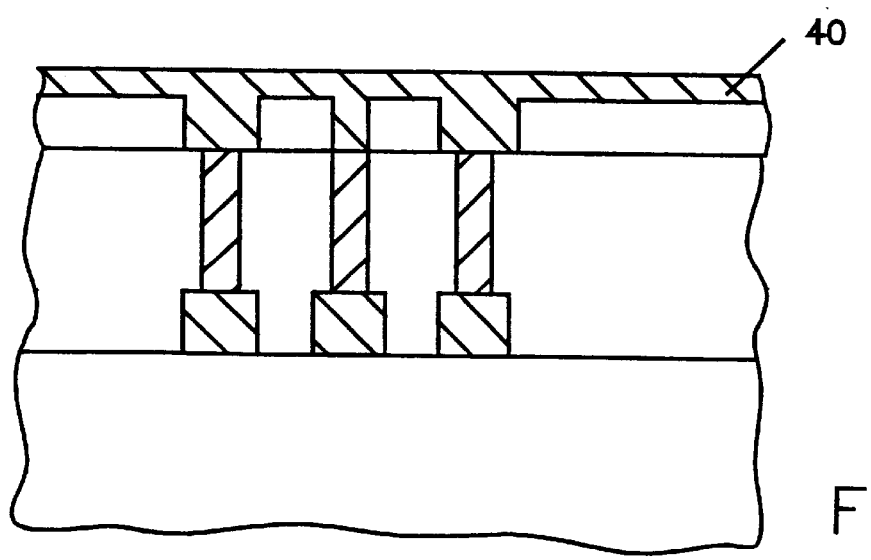
FIG. 12 is a cross-sectional view of a processing step subsequent to that shown in FIG. 11, wherein a second conductor material is deposited within the trenches, vias and across the second layer of dielectric.
Figure 13:
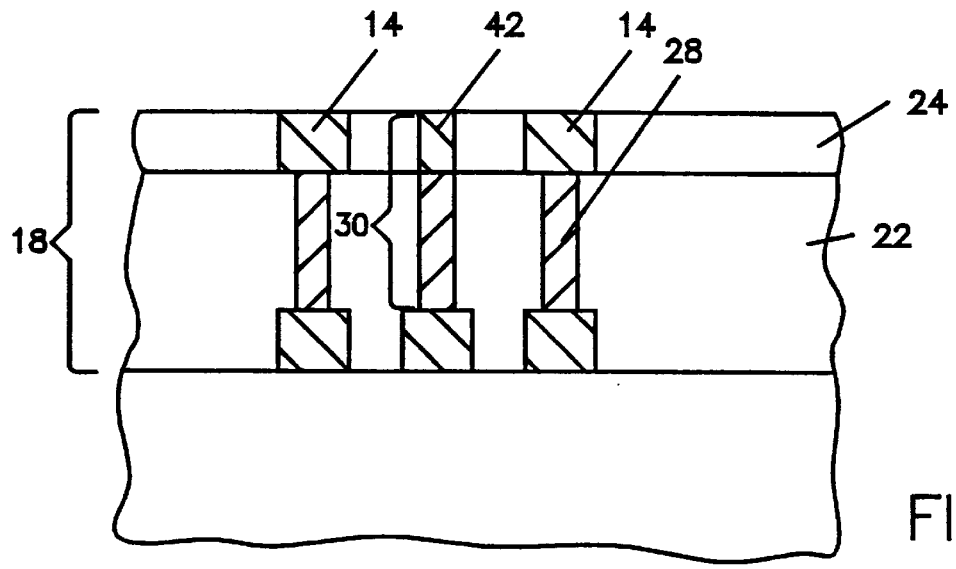
FIG. 13 is a cross-sectional view of a processing step subsequent to that shown in FIG. 12, wherein the second conductor material is removed from upper surfaces of the second layer of dielectric to form second conductors (interconnect)

FIG. 12 illustrates deposition of a conductive material 40 upon second dielectric 24 and within trenches 38 and intermediate via 34a. Conductive material 40 is herein referred to as a second conductor material. The second conductor material is generally a refractory material or aluminum. FIG. 13 illustrates removal of second conductor material 40 from the upper surface of second dielectric 24, resulting in a contact interposed and dielectrically spaced between a pair of second conductors 14. Contact 42 is aligned with and thereby forms a part of second contact structure 30. Second contact structure 30 thereby extends entirely through interlevel dielectric structure 18, whereas first contact 28 extends only through first dielectric layer 22. Second conductors 14 can be of any width necessary to carry electric current within a conductor configured, for example, in a bus structure. Contact structures 28 and 30, on the other hand, are of minimum dimension necessary to form vertical contacts between conductors ranged on dissimilar levels.

FIGS. 12 and 13 illustrate a damascene process, wherein a fill conductive material, such as second conductor material 40 is deposited across a dielectric and into openings formed within that dielectric. Thereafter, the conductor residing over the dielectric is removed. The conductive material is suitably deposited using, for example, chemical vapor deposition. Removal is suitably carried out using either an etch or polish technique.

Figure 14:
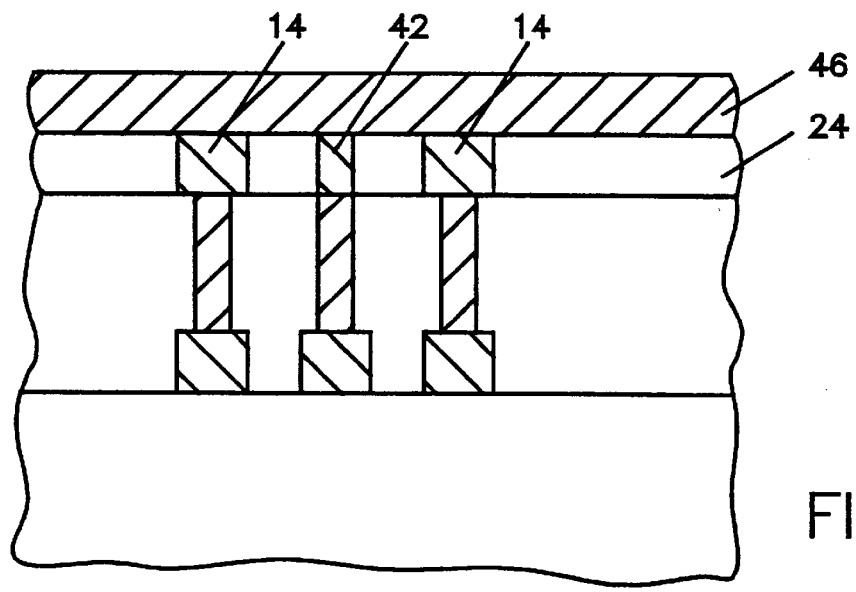
FIG. 14 is a cross-sectional view of a processing step subsequent to that shown in FIG. 13, wherein a third conductor material is deposited upon the second layer of dielectric.
Figure 15:
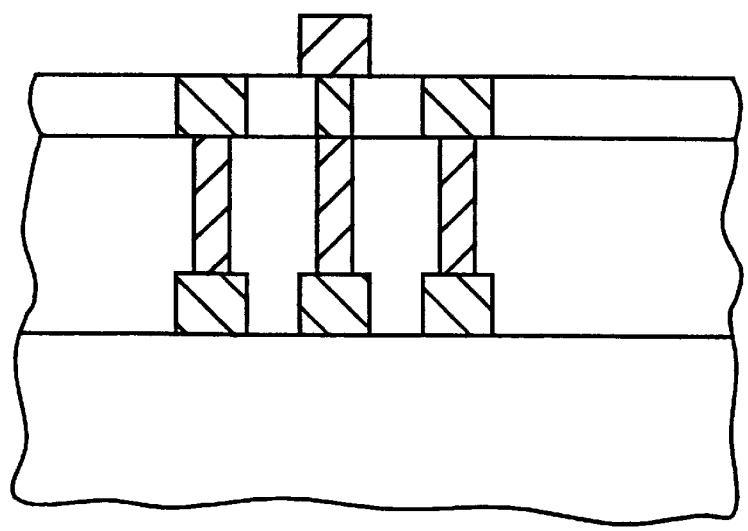
FIG. 15 is a cross-sectional view of a processing step subsequent to that shown in FIG. 14, wherein the third conductor material is selectively removed to form third conductors (interconnect) within a multilayer interconnect structure of that shown in FIG. 1.

FIG. 14 illustrates blanket deposition of a third conductor material 46. Material 46 is deposited upon second dielectric 24 as well as across second conductors 14 and intermediate conductor 42. FIG. 15 illustrates selective removal of third conductor material 46, leaving a third conductor 16. Third conductor 16 is shown according to one embodiment upon intermediate contact 42. Intermediate contact 42 thereby serves to electrically connect third conductor 16 to first conductor 12. Third conductor 16 is diagonally spaced from second conductor 14.

The processing sequence beginning with FIG. 5 and concluding with FIG. 15 can be repeated subsequent to FIG. 15, wherein third conductor 16 suffices as first conductor 12, and wherein a first dielectric layer 22 can be deposited upon third conductor 16. Accordingly, the processing steps shown in FIGS. 5-15 are but three levels of possibly numerous levels of interconnect which can be formed. Further, the processing steps described above are illustrative of an exemplary interconnect structure 10, shown in FIG. 1. However, it is understood that the arrangement of first, second and third conductors 12, 14 and 16 can take on numerous forms, and contacts therebetween can be arranged in numerous ways. The processing sequence can be repeated so as to present numerous layers of conductors, certainly more than three, if desired. The drawings and descriptions thereto are illustrative only of one exemplary form. For example, there may be instances where, depending upon the number of first and second conductors, there may be fewer or more than three contacts. The exemplary embodiments shown are therefore merely exemplary of a single form of numerous forms, all of this would be obvious to a person skilled in the art having the benefit of this disclosure. Various modifications and changes may be made to each and every processing step as would be obvious to a person skilled in the art having the benefit of this disclosure. It is intended that the following claims be interpreted to embrace all such modifications and changes and, accordingly, the specification and drawings are to be regarded in an illustrative rather than a restrictive sense.

What is claimed is:

1. A method for forming a multilevel interconnect structure, comprising:

forming a first interconnect upon a semiconductor topography;

depositing a first dielectric upon said first interconnect;

etching through said first dielectric in select regions directly above said first interconnect to form three vias;

depositing a plug conductor material within said three vias to form three plugs;

depositing a second dielectric upon said first dielectric and said three plugs;

etching through said second dielectric directly above said three plugs to form an intermediate via coplanar with and interposed between a pair of trenches;

depositing a second conductor material within said intermediate via and within said pair of trenches to form a fourth plug within said intermediate via and a pair of second interconnects within the pair of trenches; and forming a third interconnect directly above and upon said fourth plug such that the third interconnect is laterally offset from the second interconnects.

2. The method as recited in claim 1, wherein said depositing a plug conductor material comprises depositing a plug conductor material and removing said plug conductor material to an elevational level commensurate with an upper surface of the first dielectric.

3. The method as recited in claim 2, wherein said removing comprises chemical mechanical polishing.

4. The method as recited in claim 1, wherein said depositing a second conductor material comprises:

depositing a plug conductor material comprising tungsten within said intermediate via and said pair of trenches; and removing said plug conductor material to an elevational level commensurate with an upper surface of the second dielectric.

5. The method as recited in claim 4, wherein said removing comprises chemical mechanical polishing.

6. The method as recited in claim 1, wherein said forming a third interconnect comprises:

depositing a third conductor material across the second dielectric, the fourth plug and the pair of trenches; and selectively removing the third conductor material in all regions except directly above the fourth plug.

7. A method for forming a multilevel interconnect structure, comprising:

forming a lower and upper pair of vertically adjacent dielectrics upon a plurality of coplanar first interconnects;

forming a first contact extending vertically through said lower one of pair of dielectrics and forming a second contact and a plurality of coplanar second interconnects extending vertically through said upper one of said pair of dielectrics, wherein one of said plurality of second interconnects is aligned directly over the first contact a lateral spaced distance away from the second contact; and forming a plurality of coplanar third interconnects, one of which is aligned directly over and upon said second contact.

8. The method as recited in claim 7, wherein said second contact extends entirely through said pair of dielectrics.

9. The method as recited in claim 7, wherein forming said plurality of coplanar second interconnects comprises:

removing portions of the upper one of the pair of dielectrics;

filling the removed portions within a second conductor material; and removing said second conductor material slightly below an upper surface of the pair of dielectrics.

* * * * *